United States Patent
Eriksson

(10) Patent No.: US 7,667,656 B2
(45) Date of Patent: Feb. 23, 2010

(54) PRE-ALIGNMENT OUTSIDE AN ANTENNA MEASUREMENT RANGE

(75) Inventor: Mats Gunnar Hakan Eriksson, Gothenburg (SE)

(73) Assignee: Telefonaktiebolaget L M Ericsson (Publ), Stockholm (SE)

(*) Notice: Subject to any disclaimer, the term of this patent is extended or adjusted under 35 U.S.C. 154(b) by 303 days.

(21) Appl. No.: 11/576,230

(22) PCT Filed: Sep. 30, 2004

(86) PCT No.: PCT/SE2004/001402

§ 371 (c)(1),
(2), (4) Date: Oct. 9, 2007

(87) PCT Pub. No.: WO2006/036094

PCT Pub. Date: Apr. 6, 2006

(65) Prior Publication Data

US 2009/0073061 A1    Mar. 19, 2009

(51) Int. Cl.
*G01R 29/08* (2006.01)

(52) U.S. Cl. .................................................. 343/703

(58) Field of Classification Search ............. 343/703
See application file for complete search history.

(56) References Cited

U.S. PATENT DOCUMENTS

| 5,419,631 A * | 5/1995 | Slater .................. 356/508 |
| 7,086,163 B1 * | 8/2006 | Makotinsky ............ 33/286 |
| 2008/0001835 A1 * | 1/2008 | Boucher ................ 343/757 |

FOREIGN PATENT DOCUMENTS

DE    3722406 A1 * 10/1988
GB    2159667 A   * 12/1985

* cited by examiner

*Primary Examiner*—HoangAnh T Le
(74) *Attorney, Agent, or Firm*—Roger S. Burleigh

(57) ABSTRACT

A method is disclosed for optically pre-aligning and referencing an antenna set-up outside an antenna measurement range. The pre-alignment is performed in an integration room close to the antenna measurement range in order to avoid unnecessary occupation of the measurement range. The method teaches a technique using generally a pair of high accuracy theodolites (T1, T2) to by means of a room mirror reference (RM) and an antenna mirror-cube transfer a difference between the co-ordinate system of an integration tower (INT) used and the measurement range antenna tower.

3 Claims, 2 Drawing Sheets

PRE-ALIGNMENT OUTSIDE AN ANTENNA MEASUREMENT RANGE

FIELD OF INVENTION

The present invention relates to a method of pre-aligning an antenna set-up outside an antenna measurement range and more precisely to record the optical alignment of an antenna under test at an integration facility to a reference for this external facility.

BACKGROUND

Antenna measurements require that the antenna under test (AUT) is illuminated by a uniform plane wave. This requirement is generally achieved in the far field for a range length greater than $2D^2/\lambda$ where D is the largest dimension of the AUT. In many cases particularly for very short $\lambda$ this will dictate large distances. A compact range creates a plane wave field at distances considerably shorter than those needed under conventional far-field criteria. The required compact range is usually so short that the implementation can be accomplished indoors. In the compact range a uniform plane wave is generated by a large parabolic reflector with high surface accuracy. Room reflections are minimised by using absorbing material on the walls.

The classic way to align an antenna to the electrical co-ordinate system of an antenna measurement range is to do this alignment with the AUT mounted to the stable antenna tower at the measurement range to then determine the positioning of AUT in relation to the electrical co-ordinate system of the measurement range.

A problem with this classical way of measurement set-up is for instance that while the often time-consuming alignment is performed the quite expensive antenna measurement range will be occupied and can not be used for other antenna measurements. Since the antenna often also is mounted at a great height it is then complicated to achieve the desired accurate determination of the co-ordinates.

Therefore, there is a desire to simplify, as well as if possible speed up, this setting up procedure for the antenna to be tested, which has led to a new inventive method now disclosed by the present patent application.

SUMMARY OF THE INVENTION

The basis for the present method disclosed is the use a corresponding copy of the mechanical antenna under test interface attached to a similar arrangement tower within an integration facility outside the antenna measurement range. This mechanical interface generally referred to as the AUT interface is aligned to a co-ordinate system of the integration facility and thereafter transferred into the co-ordinate system of a computerised corresponding measurement range. Thus the entire extensive procedure for aligning an antenna to be tested then can be performed with high accuracy within the integration facility instead of blocking an antenna measurement range during this tedious preparation. An optical precise alignment is obtained by utilising high accuracy theodolites and a mirror-cube together with the antenna and a reference mirror of the integration facility.

A method according to the present invention is set forth by the independent claim 1, and further embodiments of the invention are set forth by the dependent claims 2 to 3.

SHORT DESCRIPTION OF THE DRAWINGS

The invention, together with further objects and advantages thereof, may best be understood by making reference to the following description taken together with the accompanying drawings, in which.

DETAILED DESCRIPTION THE INVENTION

In an illustrative embodiment utilising the method of the invention an integration room is demonstrated, localised in connection to an antenna measurement range. The integration room is equipped with a port to a measurement range and is equipped with a moveable platform, which can be driven through the port at a proper height when transferring an antenna from the integration room to the measurement range in order to easily reach the antenna measurement tower inside the antenna measurement range, which reaches for instance down a further storey.

The measurement range in an illustrative embodiment comprises microwave feeders and a large parabolic reflector with high surface accuracy for creating a plane wave-front illuminating the antenna under test (AUT) mounted onto the range tower. The entire measurement facility as well as the port is typically provided with radio wave absorbing material onto its walls in order to minimise reflections or scatter during antenna measurements.

Figure 1:
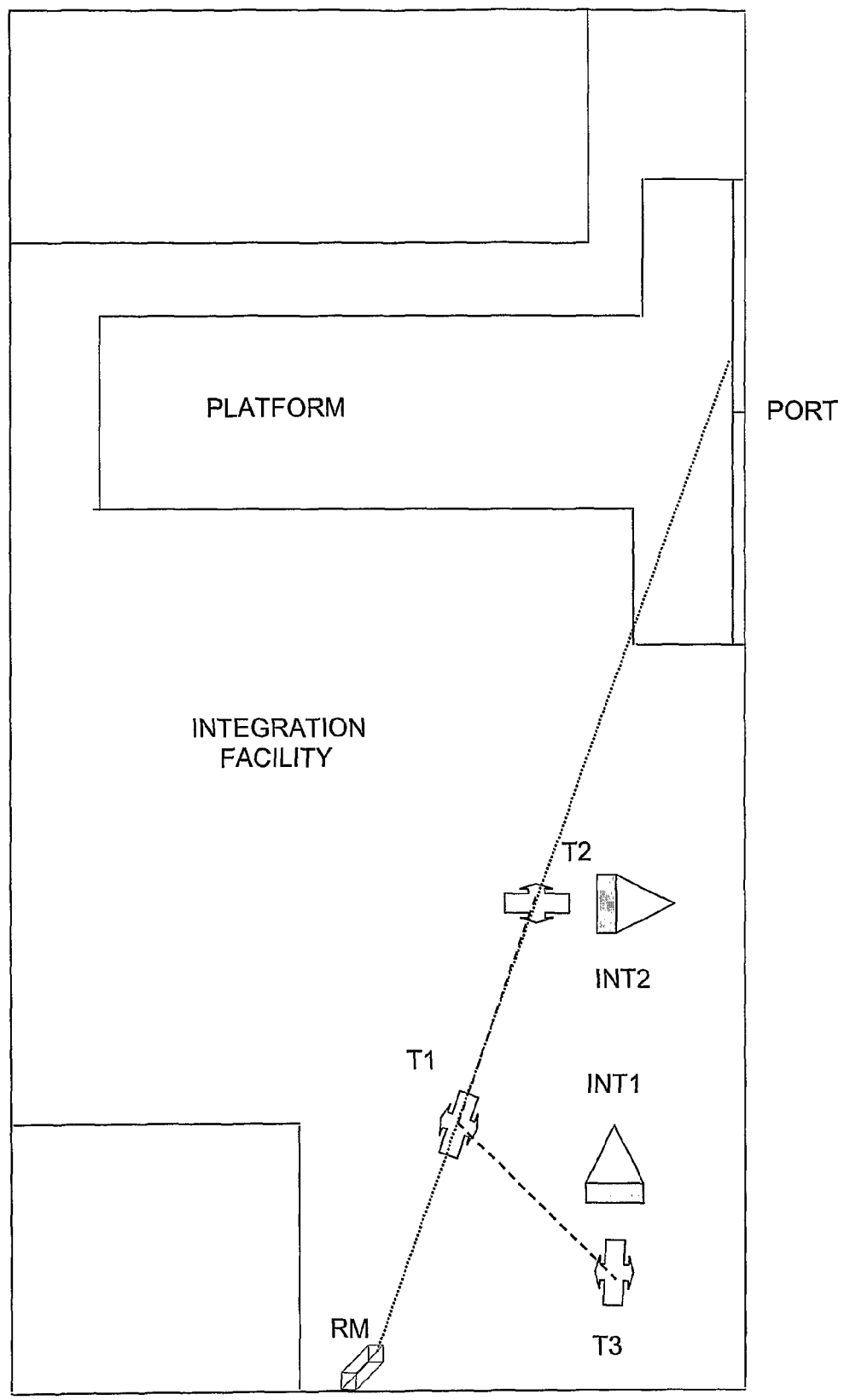
FIG. 1 illustrates an integration facility outside the antenna measurement range for a calibration of an integration tower to an integration facility reference mirror.

In order not to occupy the costly measurement range during set-up the antenna to be measured will be prepared in an integration facility at one of for instance two integration towers INT1 or INT2 (FIG. 1). By using more than a single integration tower, more than one antenna may be simultaneously prepared for measurement. Each such integration tower is equipped with an exact identical copy of the antenna positioning mechanical AUT interface or positioner of the measurement tower within the measurement range. By using an accurate identical calibrated duplicate of the mechanical AUT interface at an integration tower within the integration facility the antenna to be tested can be precisely aligned for measurement. The co-ordinates of this mechanical AUT interface is transferred to the co-ordinate system of the measurement range by utilising a facility reference mirror. The most important detail in this is to accurately determine the co-ordinate system in the integration facility and then transfer this to the measurement range. This is done by the optical method of the present invention then using the calibrated facility reference mirror. Thus the entire extensive alignment of the antenna to be tested thereby is performed within the integration facility instead of the antenna measurement range. This measurement can obtain an extremely high accuracy when using a properly set up integration facility.

A general procedure for aligning and calibrating the integration facility to a room reference mirror RM is illustrated in FIG. 1. This calibration is performed maybe once a year for a control The optical alignment of the integration towers is done by aligning to the room reference mirror a very accurate mirror fixture then mounted to each AUT-interface of the towers of the integration facility. This procedure can also be used for the calibration of an auxiliary mirror and check of error between room reference and positioner angles. The alignment is preferably performed behind drawn curtains for obtaining stable temperature. A standard torque is used for the dimension of the screws used to mount the mirror-fixture to the AUT interface and the AUT interface to the tower.

In the preferred embodiment of the present antenna optical alignment calibration method two high accuracy theodolites T1 and T2 utilising autocollimation of its hair-cross being projected onto a mirror-cube onto the mirror fixture In FIG. 1 T2 and T3 indicates a same theodolite moved to different positions.

The range co-ordinate system is a right hand orthogonal system with $Z_{range}$ defined as a horizontal axis with the positive direction from the positioner towards the reflector and the $Y_{range}$ axis vertical and directed upwards. The range co-ordinate system coincides with the electrical direction of the range.

The procedure described is based upon the very accurate positioner or AUT interface and that the facility reference is calibrated to coincide with the electrical direction of the range.

The intermediate theodolite T1 is positioned with the center of the tube at the height $H=H_{reference}$ at a stable location in the integration room with the possibility to see theodolites T2 and T3. The theodolite is at the correct position when focusing from autocollimation to the mirror surface middle is within ±3 mm vertical and horizontal.

1. Mount the mirror-fixture to the AUT interface of an integration tower.
2. Position the theodolite in front of the mirror, one meter apart. Make autocollimation with the mirror and adjust the rear height adjustment device (Nivell) until the AUT normal is orthogonal to the gravity vector.
3. Align around the AUT interface normal with a pin toggled between two steering holes to measure a line with the theodolite. Adjust the two front adjustment devices (Nivell's) until the line is parallel with the gravity vector. Thus, the integration tower stands with one rear leg and two forward legs corresponding to each one of the adjustment devices.
4. Repeat step 2 and 3 until the measures are within specification without adjusting the tower.
5. Transfer the reference direction from the reference mirror to the theodolite and an optional transfer of reference to a second theodolite.
6. Find autocollimation with the mirror-fixture.
7. Read the deviation between the room reference RM in azimuth.

Figure 2:
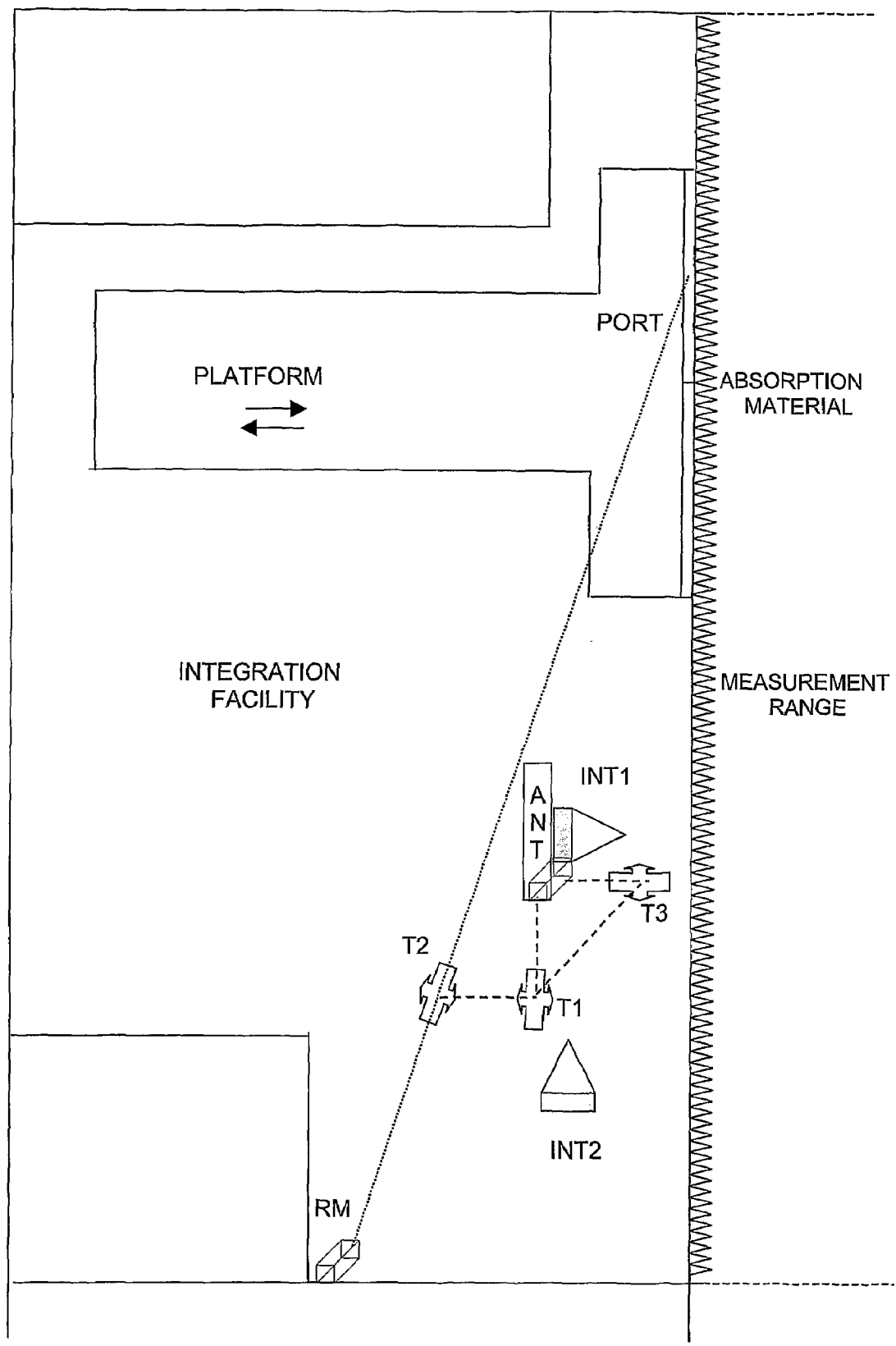
FIG. 2 illustrates an example of aligning an antenna, mounted to an integration tower of the integration facility, to its reference mirror used for referencing the antenna to the electrical co-ordinate system of the antenna measurement range.

An antenna alignment procedure according to the present inventive method is now summarised by the following steps as illustrated in FIG. 2:

In a first step the antenna is mounted to an integration tower INT1 or INT2 of FIG. 2. In a next step a theodolite T1 is positioned to make it possible to see both the reference mirror (RM) and one antenna mirror-cube side or if not possible using an intermediate theodolite T2 as illustrated in FIG. 2. In a next step autocollimation is found with the first antenna mirror surface from T1. Thereafter transfer the reference direction from the reference mirror to the theodolite T1 via the intermediate theodolite T2.

Measure the deviation from the reference mirror RM to a first surface of the antenna mirror-cube. Then find autocollimation with an orthogonal mirror-cube surface from a theodolite T3. Transfer the reference direction from theodolite T1 to theodolite T3 and read the deviation between the room reference and the two mirror surfaces from T1 and T3. Finally compensate for the offset between the electrical co-ordinate system of the antenna measurement range and integration-tower direction.

The antenna can now be moved to the measurement range for the evaluation done by the computerised measurement system, which now is in alignment with measures achieved from the integration tower of the integration room.

The advantages obtained with pre-alignment of the antenna outside the antenna measurement range are:

While performing the often time-consuming alignment the range is free and can simultaneously be used for other antenna measurements.

The height of the integration tower can be optimised for the height of normal theodolite tripods that simplifies the alignment and improves the accuracy.

It may not be possible to align directly to the positioner because of the height of the positioner or AUT interface of the measurement range.

The present method using a reference has been described relating to an illustrative integration facility in connection to an antenna measurement range, however the present pre-alignment method is of course applicable to any antenna measurement range provided with an integration facility being any area or room.

The invention claimed is:

1. A method for optically pre-aligning and referencing an antenna to be measured using an integration facility outside an antenna measurement range, the integration facility provided with an identical mechanical antenna under test interface as the measurement range, comprising the steps of:
   providing a calibrated facility reference mirror within the integration facility;
   providing an optical mirror-cube mounted with an antenna to be tested and positioned at the identical mechanical AUT interface at the integration facility; and,
   utilising at least one high accuracy theodolite for measuring deviation from the room reference mirror to the mirror-cube of the antenna, to thereby be able to transfer a difference between a co-ordinate system of the integration facility and the measurement range.

2. The method according to claim 1, further comprising the step of:
   utilising a first theodolite to autocollimate a first surface of the antenna mirror-cube, and a second theodolite for transferring a reference direction from the reference mirror to the first theodolite via the second theodolite.

3. The method according to claim 2, further comprising the step of:
   finding an autocollimation with a second orthogonal surface of the antenna mirror-cube by the second theodolite when moved to a new position and transferring the reference direction from the first theodolite to the second theodolite in the new position, and thereafter reading the deviation between the room reference and the first and second mirror-cube surfaces and compensating for the offset between an electrical co-ordinate system of the antenna measurement range and the integration facility direction.

* * * * *